US008953175B2

(12) United States Patent
Sato (10) Patent No.: US 8,953,175 B2
(45) Date of Patent: Feb. 10, 2015

(54) MARK POSITION DETECTOR, IMPRINT APPARATUS, AND ARTICLE MANUFACTURING METHOD

(75) Inventor: Hiroshi Sato, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 766 days.

(21) Appl. No.: 12/966,237

(22) Filed: Dec. 13, 2010

(65) Prior Publication Data

US 2011/0141489 A1 Jun. 16, 2011

(30) Foreign Application Priority Data

Dec. 16, 2009 (JP) ................. 2009-285744

(51) Int. Cl.
*G01B 11/14* (2006.01)
*G01B 11/02* (2006.01)
*G03F 9/00* (2006.01)
*G03F 7/00* (2006.01)

(52) U.S. Cl.
CPC .............. *G01B 11/02* (2013.01); *G03F 9/7042* (2013.01); *G03F 9/7038* (2013.01); *G03F 9/7049* (2013.01); *G03F 7/0002* (2013.01); *G03F 9/7088* (2013.01)
USPC ...................................................... 356/618

(58) Field of Classification Search
CPC ... G03F 7/0002; G03F 9/7042; G03F 9/7038; G03F 9/7049; G03F 9/7088
USPC ....... 356/618, 620, 614; 250/559.29
See application file for complete search history.

(56) References Cited

U.S. PATENT DOCUMENTS

| | | | | |
|---|---|---|---|---|
| 5,189,494 A | * | 2/1993 | Muraki | 356/401 |
| 5,477,057 A | * | 12/1995 | Angeley et al. | 250/548 |
| 6,936,931 B2 | * | 8/2005 | Baek et al. | 257/797 |
| 2006/0157444 A1 | * | 7/2006 | Nakamura et al. | 216/54 |
| 2010/0102470 A1 | * | 4/2010 | Mokaberi | 264/40.5 |

FOREIGN PATENT DOCUMENTS

| | | |
|---|---|---|
| JP | 63285404 A | 11/1988 |
| JP | 06232026 A | 8/1994 |
| JP | 2007281072 A | 10/2007 |
| JP | 4185941 B2 | 11/2008 |

OTHER PUBLICATIONS

Japanese Office Action cited in Japanese counterpart application No. JP2009-285744, dated Sep. 27, 2013.

* cited by examiner

*Primary Examiner* — Michael A Lyons
*Assistant Examiner* — Rufus Phillips
(74) *Attorney, Agent, or Firm* — Rossi, Kimms & McDowell LLP

(57) ABSTRACT

A detector for detecting a position of a mark comprises: an image sensing device; an optical system which projects the mark onto an image sensing surface of the image sensing device; a pattern located in a position between the image sensing surface and an optical element located closest to a plane on which the mark is to be located, among optical elements forming the optical system, the position being optically conjugated with the plane; and a processor which calculates a position of the mark with respect to one of a position of the pattern and a position already known from the position of the pattern, based on a moire pattern formed on the image sensing surface by the mark and the pattern.

8 Claims, 8 Drawing Sheets

MARK POSITION DETECTOR, IMPRINT APPARATUS, AND ARTICLE MANUFACTURING METHOD

BACKGROUND OF THE INVENTION

1. Field of the Invention

The present invention relates to a detector for detecting the position of a mark, an imprint apparatus, and an article manufacturing method.

2. Description of the Related Art

The imprint technique makes it possible to transfer nanoscale micropatterns, and is beginning to be put into practical use as one nanolithography technique for the mass-production of magnetic recording media and semiconductor devices. In the imprint technique, a mold having a micropattern is used as an original to form the micropattern on a substrate such as a silicon wafer or glass plate by using an apparatus such as an electron-beam exposure apparatus. The micropattern is formed by coating the substrate with a resin, and curing the resin while the pattern of the mold is pressed against the substrate with the resin being sandwiched between them. Imprint techniques presently put into practical use are the heat cycle method and photo-curing method. The heat cycle method forms a pattern by increasing the fluidity of a thermoplastic resin by heating the resin to a temperature equal to or higher than the glass transition temperature, pressing a mold against a substrate with the resin having a high fluidity being sandwiched between them, and releasing the mold from the resin after cooling. The photo-curing method forms a pattern by pressing a mold against a substrate with an ultraviolet-curing resin being sandwiched between them, curing the resin by irradiating it with ultraviolet light in this state, and releasing the mold from the cured resin. In the heat cycle method, the transfer time increases due to temperature control, and the dimensional accuracy decreases due to temperature changes. However, the photo-curing method has no such problems. Presently, therefore, the photo-curing method is advantageous in the mass-production of nanoscale semiconductor devices. Japanese Patent No. 4185941 discloses a method of aligning a mold with a shot on a substrate by detecting a mark formed on the mold and a substrate mark formed in the shot by using a scope.

SUMMARY OF THE INVENTION

In the conventional imprint apparatus, a force is applied to a mold when the mold is pressed against a resin or released from it. Since the mold may shift from one shot to another, demands have arisen for a method of always measuring the positional deviation or deformation of the mold. Accordingly, the present invention provides a detector capable of readily measuring the position of a mark usable to detect, for example, the positional deviation of a mold.

According to one aspect of the present invention, there is provided a detector for detecting a position of a mark, comprising: an image sensing device; an optical system which projects the mark onto an image sensing surface of the image sensing device; a pattern located in a position between the image sensing surface and an optical element located closest to a plane on which the mark is to be located, among optical elements forming the optical system, the position being optically conjugated with the plane; and a processor which calculates a position of the mark with respect to one of a position of the pattern and a position already known from the position of the pattern, based on a moire pattern formed on the image sensing surface by the mark and the pattern.

Further features of the present invention will become apparent from the following description of exemplary embodiments with reference to the attached drawings.

DESCRIPTION OF THE EMBODIMENTS

Embodiments of the present invention will be explained in detail below with reference to the accompanying drawings.

First Embodiment

Figure 1:
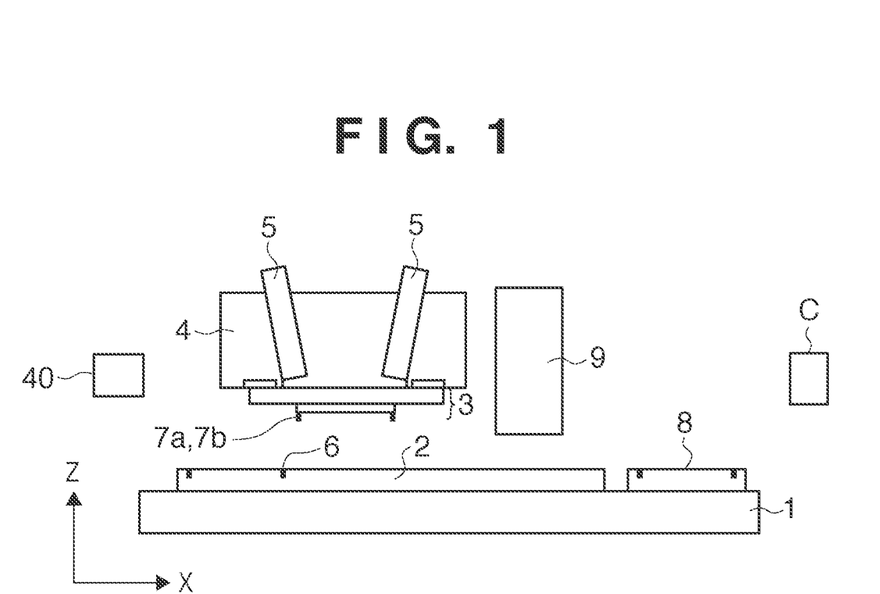
FIG. 1 is a view showing an imprint apparatus.

In an imprint apparatus according to the present invention as shown in FIG. 1, detectors (scopes) 5 are fixed to a support member (head) 4 for supporting a mold 3, in order to align the mold 3 with shots on a substrate 2 supported on a substrate stage 1. The scope 5 measures the relative positions of an alignment mark 6 (a third mark) formed in each shot on the substrate 2 and a mark 7b (a second mark) formed on the mold 3, by using a moire pattern formed when these marks are moved close to each other. The imprint apparatus performs, for each shot of the substrate 2, an imprint operation of applying a resin and curing the applied resin while the mold 3 is pressed against the resin.

Figure 2:
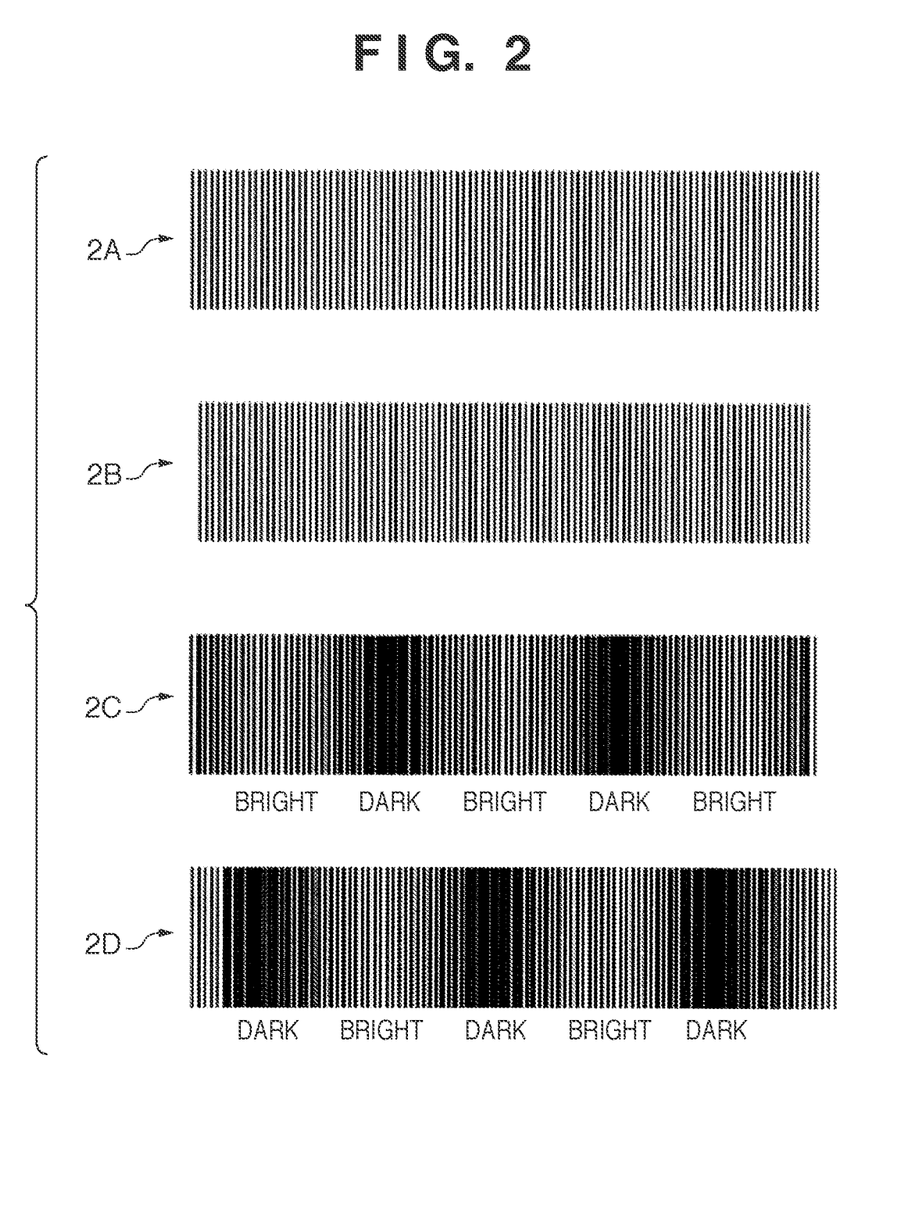
FIG. 2 is a view for explaining moire patterns.

A method of measuring the relative positions of the two marks by using the moire pattern will be explained below with reference to FIG. 2. Two types of grating marks having different pitches shown in 2A and 2B are prepared. When these grating marks are overlaid on each other, a fringe pattern having bright and dark portions forms (2C). This fringe pattern is the moire pattern. The positions of the bright and dark portions of the moire pattern change in accordance with the relative positional relationship between the two types of grating marks. For example, when one of the two types of grating marks is slightly shifted to the right, the moire pattern shown in 2C changes to a moire pattern as shown in 2D. Since this moire pattern forms as large bright and dark fringes by enlarging the actual shift between the two types of grating marks, the scope 5 can accurately measure the relative positional relationship between the two types of grating marks even when the resolving power of the scope 5 is low. Each of the marks formed on the substrate and mold can be a phase grating formed by steps of glass, or an amplitude grating formed by drawing a mark, provided that the moire pattern can be formed.

When using the moire pattern as global alignment calibration, the scope 5 first measures the relative positions of a stage reference mark 8 mounted on the substrate stage 1 and the mark 7b formed on the mold 3. After that, a controller C drives the substrate stage 1 to move the stage reference mark 8 under an off-axis alignment scope (OA scope) 9, and causes the OA scope 9 to measure the stage reference mark 8. Consequently, the relative positions (a so-called baseline amount) of the mold 3 and OA scope 9 can be measured. The controller C repeats the imprint operation for each shot by using this baseline amount and the global alignment result.

Figure 3:
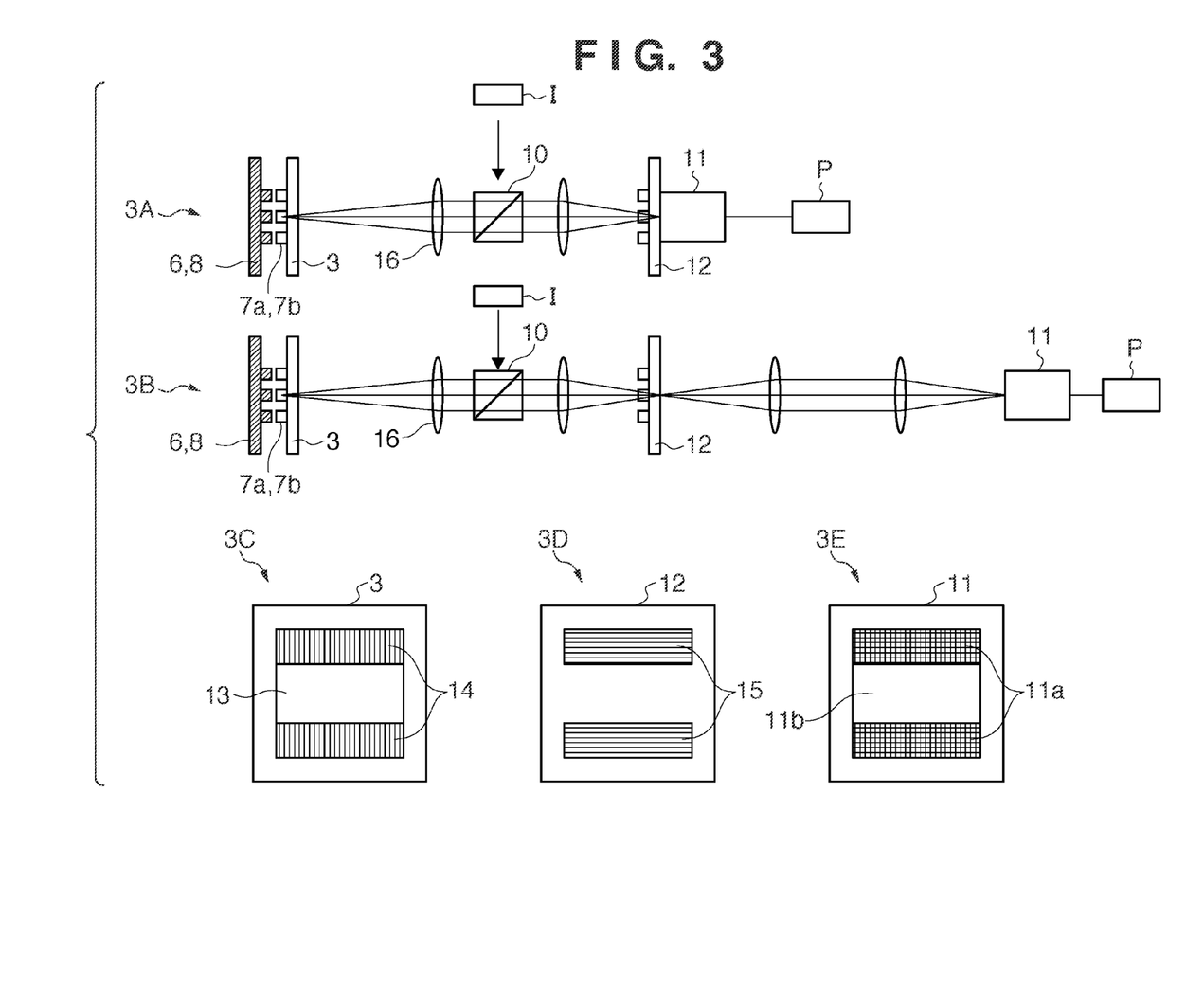
FIG. 3 is a view showing a detector of the first embodiment.

In FIGS. 3, 3A is an enlarged view of the scope 5. The alignment mark 6 (or the stage reference mark 8) formed in a shot is positioned near a mark 7a and the mark 7b formed on the mold 3. The mark 7a is a mark (first mark) to be used to detect the positional deviation of the mold 3. When the alignment mark 6 (or the stage reference mark 8) is positioned near the mark 7b, illumination light emitted from an illumination system I toward a composite prism 10 and reflected by the composite prism 10 illuminates the alignment mark 6 (or the stage reference mark 8). The alignment mark 6 (or the stage reference mark 8) is, for example, a grating mark having a pitch different from that of the mark 7b, so as to generate a moire pattern due to the relative positions of the alignment mark 6 (or the stage reference mark 8) and the mark 7b. An optical system of the scope 5 projects the alignment mark 6 (or the stage reference mark 8) and the mark 7b onto the image sensing surface of an image sensing device 11. On the basis of the moire pattern formed on the image sensing surface of the image sensing device 11 in accordance with the positional relationship between the alignment mark 6 (or the stage reference mark 8) and the mark 7b, a processor P calculates the position of the alignment mark 6 (or the stage reference mark 8) based on the position of the mark 7b. However, the result of this calculation indicates the relative position of a shot on the substrate 2 with respect to the mold 3, and does not indicate the positional deviation of the mold 3 itself.

Therefore, in the first embodiment as shown in 3A of FIG. 3, a pattern 12 as the basis of the scope 5 is located in a position optically conjugated with the surface on which the mark 7a is located. Also, the pattern 12 is located between the image sensing surface of the image sensing device 11 and an optical element 16 located closest to a plane on which the mark 7a formed on the mold 3 to be observed is to be located, among optical elements forming the optical system of the scope 5. The optical element 16 is located closest to the plane on which the mark 7a formed on the mold 3 to be observed is to be located, among the optical elements forming the optical system of the scope 5. The arrangement shown in 3A of FIG. 3 is sometimes difficult to form because the formation position of the pattern 12 is the image sensing surface of the image sensing device 11. As shown in 3B of FIG. 3, the same effect can be obtained by further connecting an imaging optical system, and forming the pattern 12 in an intermediate image plane position. In this arrangement, the optical system connecting the pattern 12 and image sensing device 11 is an optical system for forming an image of the moire pattern. Accordingly, this optical system need not have the same optical performance as that for forming an image of the mark 7a onto the pattern 12, and may have a lower optical performance (for example, may have a smaller numerical aperture). The pattern 12 can be a phase grating formed by steps of glass, or an amplitude grating formed by drawing a mark, provided that the moire pattern can be formed.

In this arrangement, the light emitted from the illumination system I toward the composite prism 10 illuminates the marks 7a and 7b in the same manner as in the prior art. An image of the mark 7a is formed on the pattern 12 in the optically conjugate position, through the imaging optical system of the scope 5. Referring to 3A of FIG. 3, an image of the moire pattern formed by the mark 7a and pattern 12 is formed on the image sensing surface of the image sensing device 11. Referring to 3B of FIG. 3, a moire pattern is formed on the pattern 12 by the mark 7a and pattern 12, and the imaging optical system forms an image of this moire pattern on the image sensing surface of the image sensing device 11. The processor P calculates the position of the mark 7a based on the position of the pattern 12, on the basis of the moire pattern formed on the image sensing surface of the image sensing device 11. The position as the basis of the position of the mark 7a may be a position already known from the position of the pattern 12.

When measuring the relative positions of the mark 7b and the alignment mark 6 (or the stage reference mark 8) by the scope 5 and measuring the position of the mark 7a, that is, the positional deviation of the mold 3 itself by the same scope 5, the image sensing region of the scope 5 need only be divided. An example will be described with reference to 3C to 3E of FIG. 3. In FIGS. 3, 3C shows the arrangement of the marks 7a and 7b formed on the mold 3, 3D shows the arrangement of the pattern 12 formed in the scope 5, and 3E shows an image formed on the image sensing device 11, as image sensing regions on the image sensing device 11. The mark 7b for measuring the relative position with respect to the alignment mark 6 (or the stage reference mark 8) on the substrate 2 is formed in a region 13 shown in 3C of FIG. 3. The mark 7a, which measures the relative position with respect to the pattern 12, is formed in a region 14 that is different from the formation region 13 of the mark 7b. A mark on the side of the pattern 12 for alignment with the mark 7a is formed in a region 15 shown in 3D of FIG. 3. Consequently, a moire pattern caused by the relative positional relationship between the mark 7b and the alignment mark 6 (or the stage reference mark 8) is formed in a second image sensing region 11b shown in 3E of FIG. 3. Also, a more pattern caused by the relative positional relationship between the mark 7a formed in the region 14 and the pattern 12 formed in the region 15 is formed in a first image sensing region 11a shown in 3E of FIG. 3. As a consequence, the moire patterns resulting from the two relative relationships can be detected by dividing the image sensing region of the scope 5.

When the marks 7a and 7b are formed in the periphery of the pattern region of the mold 3, the marks 7a and 7b are also transferred to the substrate 2 by imprinting. Accordingly, the marks 7a and 7b are formed on a scribe line having no influence even if they are transferred, but the sizes of the marks 7a and 7b are limited because they are formed in the scribe line. Therefore, marks 7a and 7b specialized to measure the position of the mold 3 are formed in the pattern region periphery outside the scribe line, and the height of the formation portion of the marks 7a and 7b is made different from that of the pattern portion of the mold 3 so that the mark formation portion does not contact the resin during imprinting. Since the sizes of the marks 7a and 7b are no longer limited, the arrangement of this embodiment becomes more effective.

In this embodiment, it is possible to always measure the relative positions of the mark 7a formed on the mold 3 and the pattern 12 in the scope 5. Accordingly, not only the shift but also the deformation of the mold 3 can be measured by measuring the mark 7a formed on the mold 3 by using the scope 5.

Figure 4:
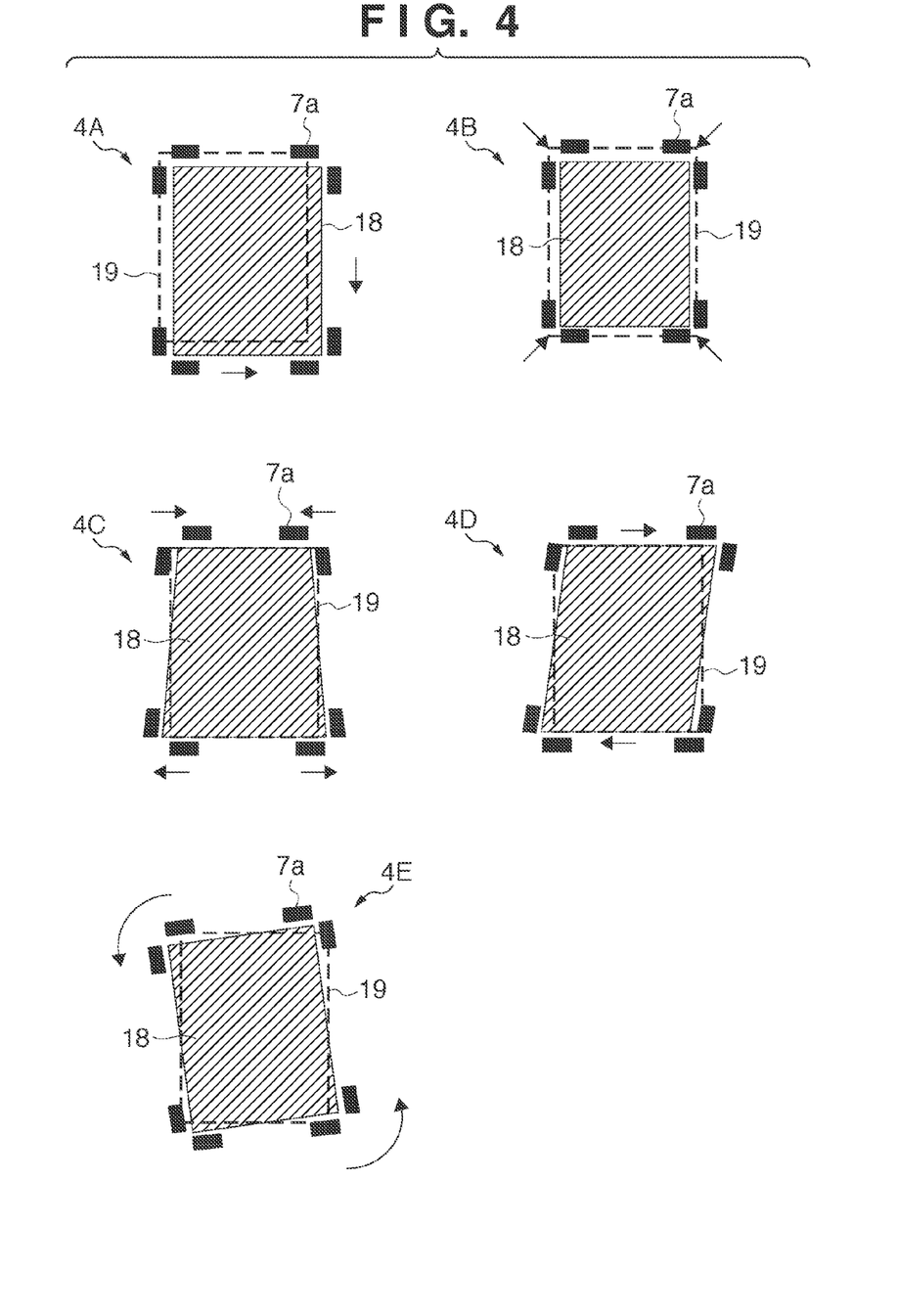
FIG. 4 is a view showing the positional deviations of a mold.

In FIGS. 4, 4A to 4E illustrate deformation examples of the mold 3. The marks 7a of the mold 3 are formed in the periphery of a shot circuit pattern region 18. Note that dotted lines 19 indicate the position of the shot pattern region 18 when there is neither a shift nor deformation of the mold 3. As shown in FIG. 4, the positional deviation of the shot circuit pattern region 18, such as shift (4A), magnification (4B), trapezoidal deformation (4C), twist (4D), or rotation (4E), causes the positional deviation of the marks 7a formed in the periphery of the circuit pattern region 18. The controller C determines, on the basis of the detection result from the detector 5, whether the positions of the marks 7a fall within an allowable range with respect to the reference positions. If the controller C determines that the positions of the marks 7a fall outside the allowable range, the controller C performs a process of correcting the positional deviation of the mold 3.

If the positional deviation to be corrected is a shift of the mold 3 with respect to the reference position, the controller C performs an imprint operation by driving the substrate stage 1 by the amount of the detected shift. That is, if a shift of the mold 3 is detected, the controller C performs calibration measurement by using the stage reference mark 8, and corrects the difference from the calibration measurement by driving the substrate stage 1. If the positional deviation to be corrected is the rotation of the mold 3 with respect to the reference position, the controller C rotates the substrate stage 1 so as to correct the amount of the detected rotation, thereby rotating the substrate 2 relative to the mold 3. Alternatively, the controller C rotates the support member 4, or causes a mounting mechanism 40 to detach the mold 3 from the support member 4 and reattach the mold 3 to the support member 4 after that. The mounting mechanism 40 is, for example, a robot that attaches the mold 3 to the support member 4 and detaches the mold 3 from the support member 4.

Figure 8:
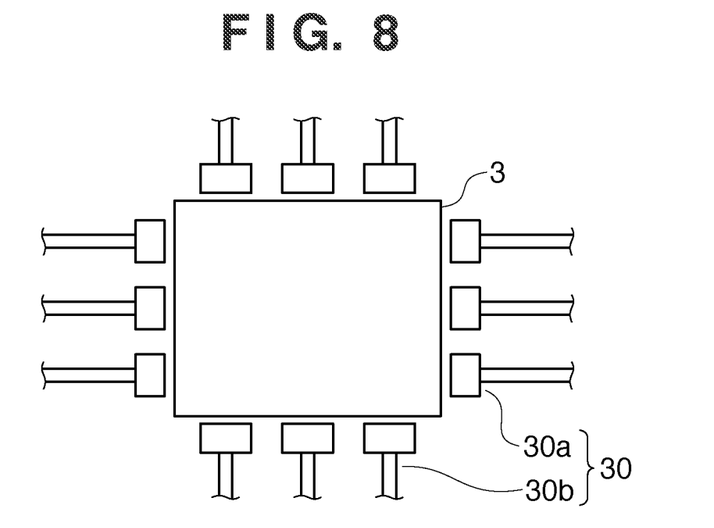
FIG. 8 is a plan view of a deforming mechanism for deforming a mold.

If the magnification deviation, trapezoidal deformation, or twist deviation occurs as shown in 4B, 4C or 4E of FIG. 4, respectively, the shape of the mold 3 has presumably changed. If the deformation of the mold 3 is detected, the controller C corrects the shape by changing the shape of the mold 3 itself by operating a deforming mechanism that deforms the mold 3 in a direction parallel to the surface on which the circuit pattern is formed, as a measure to cope with an error. FIG. 8 shows an example of a deforming mechanism 30. The deforming mechanism 30 includes sticking portions 30a that stick to the side surfaces of the mold 3, and actuators 30b that press the sticking portions 30a against the mold 3 or move the sticking portions 30a away from the mold 3. The controller C acquires the relationship between the driving amount of the actuators 30b and the deformation amount of the mold 3 beforehand, and drives the actuators 30b based on this relationship and a necessary deformation amount corresponding to the measurement result. When the deformation of the mold 3 is corrected, the relative positions of the mold 3 and substrate 2 may have changed. In this case, it is only necessary to perform calibration measurement, for example, remeasure the above-described baseline amount.

In this embodiment as described above, it is possible to always measure the relative position of the mold 3 with respect to the scope 5 by the moire pattern generated by the pattern 12 of the scope 5 and the mark 7a of the mold 3. This makes it possible to always perform the measurement of the positional deviation of the mold 3, which is conventionally impossible.

Second Embodiment

A scope 5 of the second embodiment will be explained below with reference to FIG. 5. As shown in 5A of FIG. 5, an imaging optical system of the scope 5 is branched, and image sensing devices 11a and 11b are located after the branch point. The image sensing devices 11a and 11b form an image sensing unit. In this arrangement, illumination light emitted from an illumination system I toward a composite prism 10 and reflected by the composite prism 10 strikes marks 7a and 7b of a mold 3. Images of the marks 7a and 7b are guided by the imaging optical system of the scope 5, and split by a beam splitter 20. The image sensing device 11a formed in a position where an image reflected by the beam splitter 20 is formed will be referred to as a first image sensing device. The image sensing device 11b formed in a position where an image transmitted through the beam splitter 20 is formed will be referred to as a second image sensing device.

The image sensing surface of the second image sensing device 11b is a light-receiving portion of an optical system for detecting a moire pattern generated by the relative positional relationship between the mark 7b and a mark 6 (or a stage reference mark 8) on a substrate 2. The image sensing surface of the image sensing device 11a is a light-receiving portion of an optical system for detecting a moire pattern generated by the relative positional relationship between the mark 7a and a pattern 12. The pattern 12 is formed in a position conjugated with the mark 7a of the mold 3. As in the first embodiment, if it is difficult to locate the pattern 12 near the first image sensing device 11a, the same effect can be obtained by further connecting an imaging optical system, and locating the pattern 12 in an intermediate image plane (5B of FIG. 5). In this embodiment, the optical system connecting the pattern 12 and first image sensing device 11a need only form an image of the moire pattern, as in the first embodiment. Accordingly, this optical system need not have the same optical performance as that for forming an image of the mark 7a onto the pattern 12, and may have a lower optical performance (for example, may have a smaller numerical aperture).

In this embodiment, the image sensing region of one image sensing device 11 need not be divided into two regions unlike in the first embodiment, and alignment is performed using the different image sensing devices 11a and 11b with respect to the marks 7a and 7b formed on the mold 3. This makes it possible to increase the width of the marks 7a and 7b in the non-measurement direction, and ensure the light amount. Also, the mark 7a need not be different from the conventional mark and can be the same as the conventional mark, unlike in the first embodiment in which the image sensing region is divided. It is, of course, also possible to divide the image sensing region, and form a mark more suited to measure the relative positions of the mark 7a and pattern 12.

Figure 5:
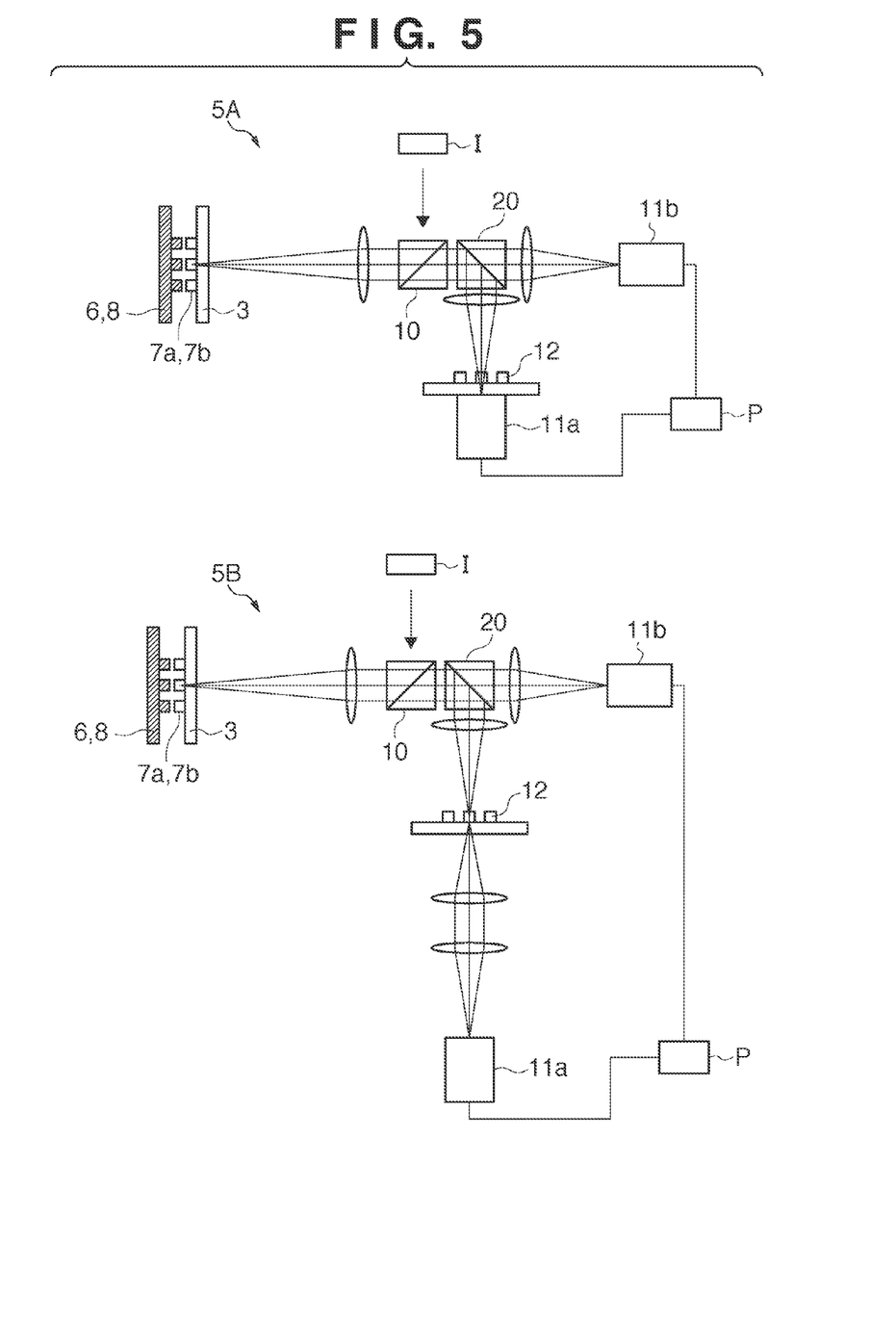
FIG. 5 is a view showing a detector of the second embodiment.
Figure 6:
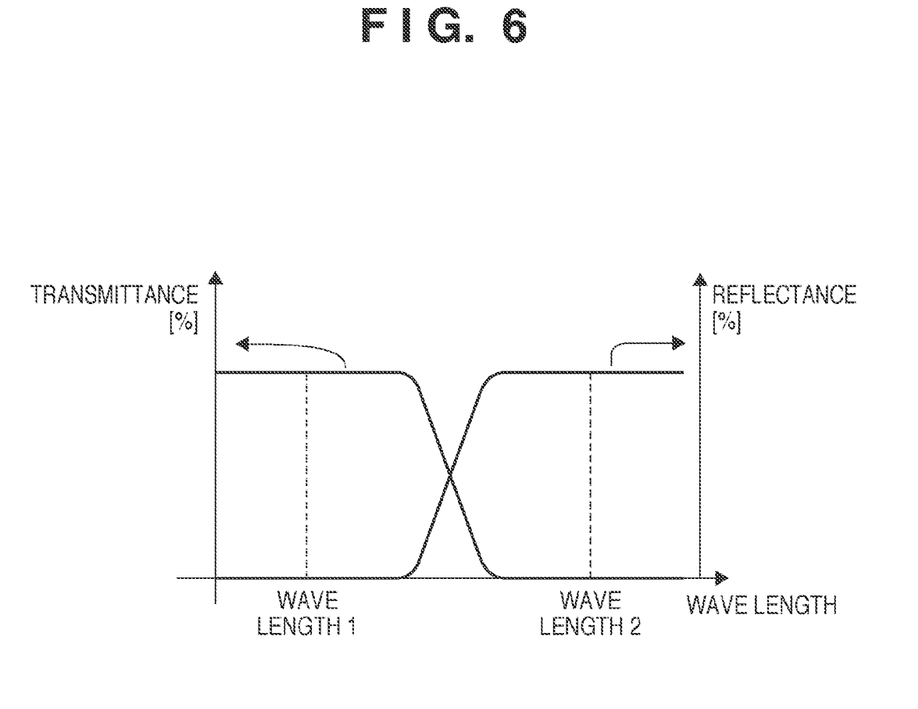
FIG. 6 is a view showing the reflectance characteristics of a composite prism of the second embodiment.

When a simple half mirror is used as the beam splitter 20 as shown in 5A and 5B of FIG. 5, the light amount on each of the image sensing devices 11a and 11b may largely reduce. This reduction in light amount can be suppressed by changing the transmittance (reflectance) for each waveform. For example, let wavelength 1 be the wavelength of the illumination light when measuring the relative positions of the mark 7b and the mark 6 (or the stage reference mark 8), and wavelength 2 be the wavelength of the illumination light when measuring the relative positions of the pattern 12 and mark 7a. As shown in FIG. 6, the beam splitter 20 need only have a high transmittance and low reflectance to the illumination light having wavelength 1, and a low transmittance and high reflectance to the illumination light having wavelength 2. It is also possible to produce differences in transmittance and reflectance of the beam splitter 20 by using polarization, instead of the wavelength of the illumination light.

In this embodiment as described above, it is possible to always measure the position of the mark 7a with respect to the pattern 12 by the moire pattern of the pattern 12 of the scope 5 and the mark 7a. Also, on the basis of this position, the positional deviation of the mold 3 can always be measured by the same method as that of the first embodiment.

Third Embodiment

A scope 5 of the third embodiment will be explained below with reference to FIG. 7. As shown in 7A of FIG. 7, an illumination system (first illumination system) Ia for projecting a slit image is formed in addition to an illumination system (second illumination system) Ib for illuminating marks 7a and 7b. As in the first and second embodiments, illumination light emitted from the illumination system Ib is reflected by a composite prism 10, and illuminates a mark 6 (or a stage reference mark 8) on a substrate 2. A moire pattern is generated by the relative positional relationship between the mark 6 (or the stage reference mark 8) and the mark 7b, and an imaging optical system of the scope 5 forms an image of bright and dark portions of the moire pattern on the image sensing surface of an image sensing device 11. In addition, a slit 21 is formed in a position optically conjugated with the mark 7a. The slit 21 is designed to have a desired pitch, when projected onto the mark 7a, by the addition of the magnification of the optical system. A moire pattern is generated by the relative positional relationship between the mark 7a and a slit pattern projected onto the mark 7a by the slit 21. Since the positions of bright and dark portions of the moire pattern change in accordance with the relative positions of the slit pattern and mark 7a, the relative positional relationship between the slit pattern and mark 7a can be calculated. That is, the position of the mark 7a (a mold 3) can be measured on the basis of the slit 21.

Figure 7:
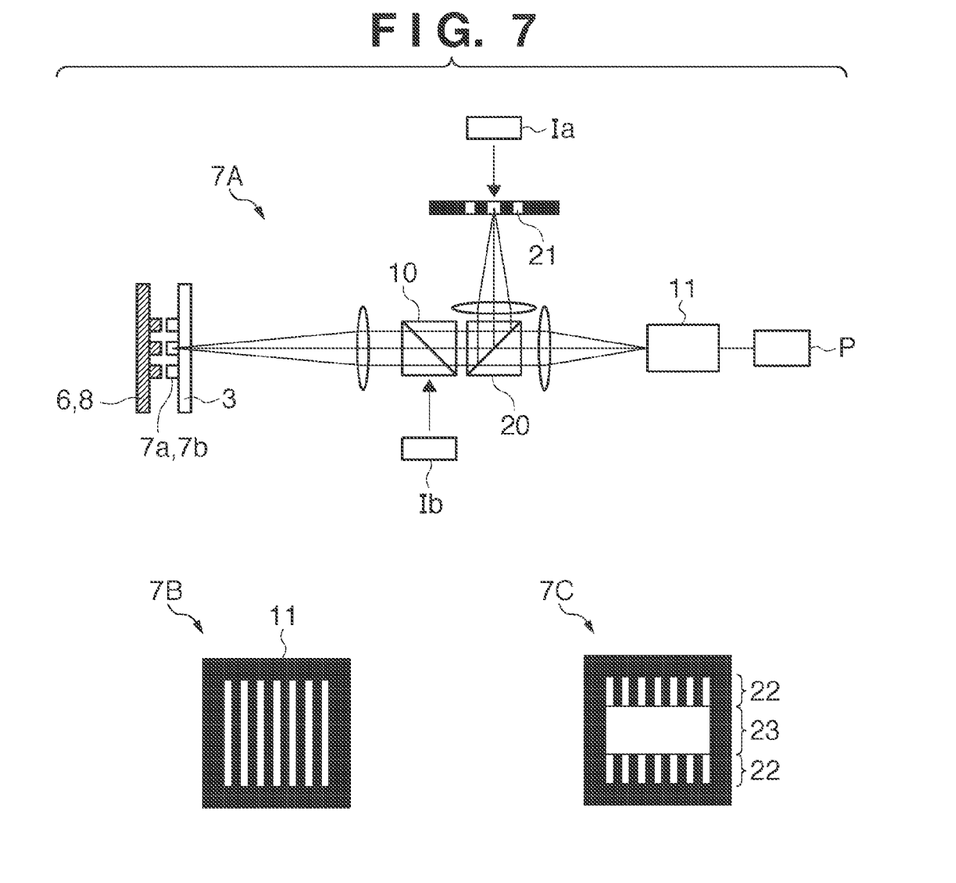
FIG. 7 is a view showing a detector of the third embodiment.

In FIGS. 7, 7B is a plan view of the slit 21. Light guided from the illumination system Ia irradiates the slit 21. The image of the slit 21 is reflected by a beam splitter 20, and projected onto the mark 7a. The projected slit pattern and the mark 7a generate a moire pattern. The imaging optical system in the scope 5 forms an image of this moire pattern on the image sensing surface of the image sensing device 11. The measurement of the relative positions of the slit pattern and mark 7a is performed at a timing that is different from that of the measurement of the relative positions of the mark 6 (or the stage reference mark 8) and the mark 7b. For example, the light for illuminating the slit 21 need only be emitted only when measuring the relative positions of the slit 21 and mark 7a.

If it is difficult to form two illumination systems, it is also possible to use one illumination system by dividing the image sensing surface of the image sensing device 11 as shown in 7C of FIG. 7. Although the illumination system Ia including the slit 21 shown in 7C of FIG. 7 is the only illumination system, the image sensing surface of the image sensing device 11 is divided into regions 22 and 23. As described above, the region 22 senses an image of the moire pattern generated by the mark 7a and the slit pattern projected onto the mark 7a. The region 23 senses an image of the moire pattern generated by the mark 7b and the alignment mark 6 (or the stage reference mark 8). Also, as in the second embodiment, giving the beam splitter 20 a reflectance difference for each system by the wavelength or polarization can ensure the light amount.

In this embodiment as described above, the relative position of the mark 7a can always be measured by the moire pattern of the slit 21 of the scope 5 and the mark 7a. In addition, on the basis of this relative position, the positional deviation of the mold 3 can always be measured by the same method as that of the first embodiment. Note that this embodiment has described the form in which the beam splitter 20 reflects the light emitted from the illumination system Ia. However, it is also possible to switch, for example, the positions of the illumination system Ia and image sensing device 11. In this arrangement, a moire pattern generated by light that is emitted from the illumination system Ia and guided to the mold 3 through the slit 21 and beam splitter 20 is reflected by the beam splitter 20 and guided to the image sensing device 11. In 7A of FIG. 7, the positions of the illumination system Ib and image sensing device 11 can also be switched.

[Article Manufacturing Method]

A method of manufacturing devices (for example, a semiconductor integrated circuit device and liquid crystal display device) as articles includes a step of forming a circuit pattern on a substrate (wafer, glass plate, or film-like substrate) by using the above-described imprint apparatus. This manufacturing method can further include a step of etching the substrate on which the circuit pattern is formed. Note that when manufacturing another article such as a patterned medium (recording medium) or optical element, the manufacturing method can include another step of processing the substrate on which the circuit pattern is formed, instead of the etching step. The article manufacturing method of this embodiment is superior to the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-285744, filed Dec. 16, 2009, which is hereby incorporated by reference herein in its entirety.

What is claimed is:

1. An imprint apparatus for performing, for each shot of a substrate, an imprint operation of coating the substrate with a resin, and curing the resin while contacting a mold having a circuit pattern with the resin, the apparatus comprising:
    a substrate stage which supports the substrate;
    a support member which supports the mold; and
    a detector fixed to the support member to detect positions of a first mark and a second mark formed on the mold and a position of a third mark formed in a shot of the substrate;
    the detector comprising:
    a first image sensing device which senses the first mark;
    a second image sensing device which is different from the first image sensing device;
    an optical system which projects the first mark onto an image sensing surface of the first image sensing device, and projects the second mark and the third mark near the second mark onto an image sensing surface of the second image sensing device;
    an optical element which splits light from the first mark within an optical path of the optical system;
    a pattern located in a position in an optical path, which light from the first mark passes through, split by the optical element, the position being on the image sensing surface of the first image sensing device or being optically conjugated with the image sensing surface of the first image sensing device; and
    a processor which calculates a position of the first mark with respect to one of a position of the pattern and a position already known from the position of the pattern, based on the first mark and the pattern sensed by the first image sensing device, and calculates a position of the second mark with respect to the third mark based on the second mark and the third marks sensed by the second image sensing device.

2. The apparatus according to claim 1, further comprising:
    a mounting mechanism which attaches the mold to the support member and detaches the mold from the support member; and a deforming mechanism which deforms the mold in a direction parallel to a surface on which the circuit pattern is formed, wherein if the positional deviation to be corrected is a shift of the mold with respect to the support member, the controller performs the imprint operation by driving the substrate stage by an amount of the detected shift, if the positional deviation to be corrected is a rotation of the mold with respect to the support member, the controller executes, in order to correct the detected rotational amount, one of rotating the substrate with respect to the mold by rotating the substrate stage, rotating the mold with respect to the substrate by rotating the support member, and causing the mounting mechanism to detach the mold from the support member and reattach the mold to the support member thereafter, and if the positional deviation to be corrected is one of magnification deviation, twist deviation, and trapezoidal deformation of the shot with respect to the mold, the controller operates the deforming mechanism to correct one of the detected magnification deviation, twist deviation, and trapezoidal deformation.

3. The apparatus according to claim 1, further comprising:
a controller which determines, from a detection result of the detector, whether the position of the mark with respect to one of the position of the pattern and the position already known from the position of the pattern falls within an allowable range, and corrects a positional deviation of the mold if it is determined that the position of the mark falls outside the allowable range.

4. The apparatus according to claim 1, wherein the processor calculates the position of the first mark based on a moire pattern formed in the first image sensing device by the first mark and the pattern, and calculates the positions of the second mark and the third mark based on a moire pattern formed in the second image sensing device by the second mark and the third mark.

5. An imprint apparatus for performing, for each shot of a substrate, an imprint operation of coating the substrate with a resin, and curing the resin while contacting a mold having a circuit pattern with the resin, the apparatus comprising:
a substrate stage which supports the substrate;
a support member which supports the mold;
a detector fixed to the support member to detect positions of a first mark and a second mark formed on the mold and a position of a third mark formed in a shot of the substrate; and
a controller,
the detector comprising:
an image sensing unit including a first image sensing region and a second image sensing region;
an optical system which projects a first mark onto the first image sensing region, and projects a second mark and a third mark positioned near the second mark onto the second image sensing region;
a pattern located in a position between the first image sensing region and an optical element located closest to a plane on which the first mark is to be located, among optical elements forming the optical system, the position being optically conjugated with the plane; and
a processor which calculates a position of the first mark with respect to one of a position of the pattern and a position already known from the position of the pattern, based on an image formed in the first image sensing region by the first mark and the pattern, and calculates a position of the third mark with respect to a position of the second mark, based on an image formed in the second image sensing region by the second mark and the third mark, and the controller determines, from a detection result of the detector, whether the position of the first mark with respect to one of the position of the pattern and the position already known from the position of the pattern falls within an allowable range, and, if it is determined that the position of the first mark falls outside the allowable range, corrects a positional deviation of the mold, and aligns the shot with the mold based on the position of the third mark with respect to the position of the second mark.

6. The apparatus according to claim 5, further comprising:
a mounting mechanism which attaches the mold to the support member and detaches the mold from the support member; and
a deforming mechanism which deforms the mold in a direction parallel to a surface on which the circuit pattern is formed, wherein if the positional deviation to be corrected is a shift of the mold with respect to the support member, the controller performs the imprint operation by driving the substrate stage by an amount of the detected shift, if the positional deviation to be corrected is a rotation of the mold with respect to the support member, the controller executes, in order to correct the detected rotational amount, one of rotating the substrate with respect to the mold by rotating the substrate stage, rotating the mold with respect to the substrate by rotating the support member, and causing the mounting mechanism to detach the mold from the support member and reattach the mold to the support member thereafter, and if the positional deviation to be corrected is one of magnification deviation, twist deviation, and trapezoidal deformation of the shot with respect to the mold, the controller operates the deforming mechanism to correct one of the detected magnification deviation, twist deviation, and trapezoidal deformation.

7. An imprint apparatus for performing, for each shot of a substrate, an imprint operation of coating the substrate with a resin, and curing the resin while contacting a mold having a circuit pattern with the resin, the apparatus comprising:
a substrate stage which supports the substrate;
a support member which supports the mold;
a detector fixed to the support member to detect positions of a first mark and a second mark formed on the mold and a position of a third mark formed in a shot of the substrate; and
the detector comprising:
an image sensing unit including a first image sensing region and a second image sensing region;
an optical system which projects a first mark onto the first image sensing region, and projects a second mark and a third mark positioned near the second mark onto the second image sensing region;
a pattern located in a position between the first image sensing region and an optical element located closest to a plane on which the first mark is to be located, among optical elements forming the optical system, the position being optically conjugated with the plane; and
a processor which calculates a position of the first mark with respect to one of a position of the pattern and a position already known from the position of the pattern, based on an image formed in the first image sensing region by the first mark and the pattern, and calculates a position of the third mark with respect to a position of the second mark, based on an image formed in the second image sensing region by the second mark and the third mark.

8. The apparatus according to claim 7, wherein the processor calculates the position of the first mark based on a moire pattern formed in the first image sensing region by the first mark and the pattern, and calculates the positions of the third mark based on a moire pattern formed in the second image sensing region by the second mark and the third mark.

* * * * *